United States Patent
Leeman et al.

(10) Patent No.: US 10,290,452 B2
(45) Date of Patent: May 14, 2019

(54) METHOD AND APPARATUS FOR AUTOMATIC ENGAGEMENT OF ARC REDUCTION TECHNOLOGY

(71) Applicant: EATON INTELLIGENT POWER LIMITED, Dublin (IE)

(72) Inventors: Daniel Jason Leeman, Holly Springs, NC (US); Forrest Dustin Secosky, Cary, NC (US); Brian Christopher Wallace, Durham, NC (US); Paul Newman, Rolesville, NC (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

(21) Appl. No.: 15/674,704

(22) Filed: Aug. 11, 2017

(65) Prior Publication Data

US 2019/0051483 A1 Feb. 14, 2019

(51) Int. Cl.
*H02B 1/38* (2006.01)
*H01H 71/10* (2006.01)
*H03K 17/95* (2006.01)
*H03K 17/94* (2006.01)

(52) U.S. Cl.
CPC ............... *H01H 71/10* (2013.01); *H02B 1/38* (2013.01); *H03K 17/941* (2013.01); *H03K 17/952* (2013.01)

(58) Field of Classification Search
CPC ........ H01H 71/10; H02B 1/38; H03K 17/941; H03K 17/952

USPC .......................................................... 361/622
See application file for complete search history.

(56) References Cited

U.S. PATENT DOCUMENTS

| | | | | |
|---|---|---|---|---|
| 3,896,353 | A * | 7/1975 | Burton | H02B 11/133 200/50.26 |
| 5,905,244 | A * | 5/1999 | Smith | H02B 11/12 200/50.17 |
| 6,141,192 | A * | 10/2000 | Garzon | H01H 33/26 361/5 |
| 7,570,465 | B2 * | 8/2009 | Beatty, Jr. | H02H 1/0015 361/42 |
| 8,223,466 | B2 * | 7/2012 | Roscoe | H02H 1/0023 361/111 |
| 8,908,335 | B2 * | 12/2014 | Malkowski, Jr. | H02B 11/04 361/12 |
| 2002/0101141 | A1 * | 8/2002 | Leccia | E05C 19/006 312/326 |
| 2009/0161270 | A1 * | 6/2009 | Beatty, Jr. | H02H 1/0015 361/42 |
| 2012/0097413 | A1 * | 4/2012 | Bugaris | H02B 13/025 174/50 |

* cited by examiner

*Primary Examiner* — Anatoly Vortman
(74) *Attorney, Agent, or Firm* — Eckert Seamans

(57) ABSTRACT

An automatic actuator assembly including a passive actuator assembly and a detection assembly is operatively coupled to an arc reduction assembly. The passive actuator assembly is coupled to the arc reduction assembly and structured to move the arc reduction assembly between a disengaged, first configuration and an engaged, second configuration.

20 Claims, 4 Drawing Sheets

METHOD AND APPARATUS FOR AUTOMATIC ENGAGEMENT OF ARC REDUCTION TECHNOLOGY

BACKGROUND OF THE INVENTION

Field of the Invention

The disclosed and claimed concept relates to electric systems and, more specifically, to an electric system including a housing assembly that encloses an electrical component and an arc reduction assembly wherein the arc reduction assembly is passively actuated.

Background Information

Electrical systems include electrical components, such as, but not limited to, low voltage switchboards and motor control centers. The electrical components are often disposed in an enclosure or housing assembly. Arc reduction technology, identified herein as an arc reduction assembly, is required to be installed within the enclosures when the equipment supplies power over 1000 Amps. The electrical components require maintenance on a regular basis. The arc reduction assembly is structured to protect a user and the equipment during maintenance as well as other times. The use of the arc reduction assembly, however, is dependent upon the user actuating the arc reduction assembly. That is, the user must manually actuate a switch, dial or other actuator to enable the arc reduction assembly. The user does not always enable the arc reduction assembly and thereby exposes the user and the equipment to potential damage. The failure to have the arc reduction technology enabled during maintenance operations and other times is a problem.

There is, therefore, a need for an automatic actuator assembly for an arc reduction assembly that actuates the arc reduction assembly when a user is near the electrical system housing assembly and/or when a user accesses the electrical system housing assembly. There is a further need for an automatic actuator assembly that operates passively, i.e., without input from the user.

SUMMARY OF THE INVENTION

These needs, and others, are met by at least one embodiment of the disclosed and claimed concept which provides an automatic actuator assembly including a passive actuator assembly and a detection assembly. The passive actuator assembly is coupled to the arc reduction assembly and structured to move the arc reduction assembly between a disengaged, first configuration and an engaged, second configuration. The passive actuator assembly is further structured to receive and react to a proximity communication, wherein, when the proximity communication is not present, the actuator assembly configures the arc reduction assembly in the disengaged, first configuration, and when the proximity communication is present, the actuator assembly configures the arc reduction assembly in the engaged, second configuration. The detection assembly is structured to detect at least one of the presence of a user adjacent a housing assembly or movement of a housing assembly door. The detection assembly is further structured to provide a proximity communication to the passive actuator assembly.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
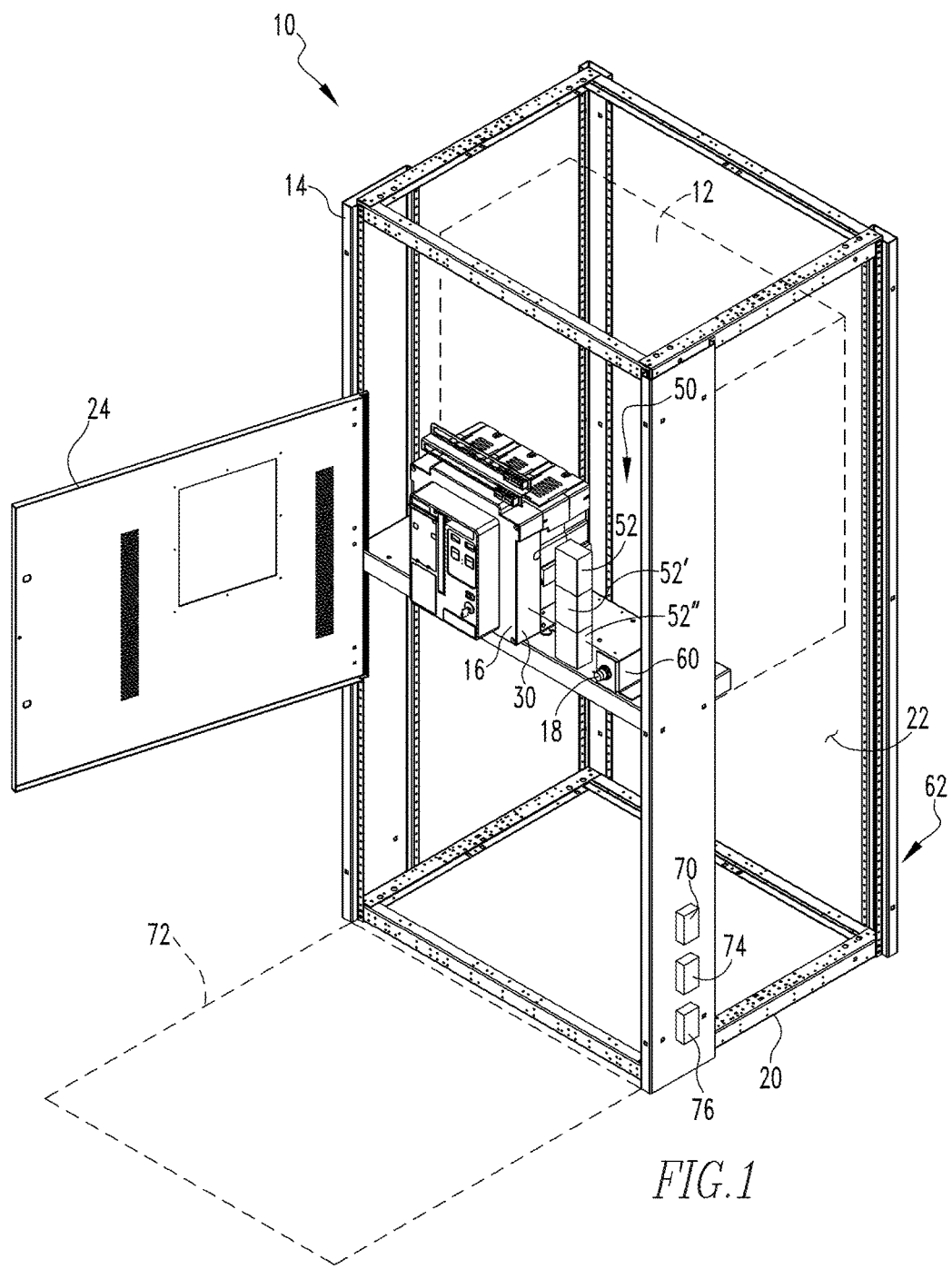
FIG. 1 is an isometric view of an electrical component system.

It will be appreciated that the specific elements illustrated in the figures herein and described in the following specification are simply exemplary embodiments of the disclosed concept, which are provided as non-limiting examples solely for the purpose of illustration. Therefore, specific dimensions, orientations, assembly, number of components used, embodiment configurations and other physical characteristics related to the embodiments disclosed herein are not to be considered limiting on the scope of the disclosed concept.

Directional phrases used herein, such as, for example, clockwise, counterclockwise, left, right, top, bottom, upwards, downwards and derivatives thereof, relate to the orientation of the elements shown in the drawings and are not limiting upon the claims unless expressly recited therein.

As used herein, the singular form of "a," "an," and "the" include plural references unless the context clearly dictates otherwise.

As used herein, "structured to [verb]" means that the identified element or assembly has a structure that is shaped, sized, disposed, coupled and/or configured to perform the identified verb. For example, a member that is "structured to move" is movably coupled to another element and includes elements that cause the member to move or the member is otherwise configured to move in response to other elements or assemblies. As such, as used herein, "structured to [verb]" recites structure and not function. Further, as used herein, "structured to [verb]" means that the identified element or assembly is intended to, and is designed to, perform the identified verb. Thus, an element that is merely capable of performing the identified verb but which is not intended to, and is not designed to, perform the identified verb is not "structured to [verb]."

As used herein, "associated" means that the elements are part of the same assembly and/or operate together, or, act upon/with each other in some manner. For example, an automobile has four tires and four hub caps. While all the elements are coupled as part of the automobile, it is understood that each hubcap is "associated" with a specific tire.

As used herein, a "coupling assembly" includes two or more couplings or coupling components. The components of a coupling or coupling assembly are generally not part of the same element or other component. As such, the components of a "coupling assembly" may not be described at the same time in the following description.

As used herein, a "coupling" or "coupling component(s)" is one or more component(s) of a coupling assembly. That is, a coupling assembly includes at least two components that are structured to be coupled together. It is understood that the components of a coupling assembly are compatible with each other. For example, in a coupling assembly, if one coupling component is a snap socket, the other coupling component is a snap plug, or, if one coupling component is a bolt, then the other coupling component is a nut.

As used herein, a "fastener" is a separate component structured to couple two or more elements. Thus, for example, a bolt is a "fastener" but a tongue-and-groove coupling is not a "fastener." That is, the tongue-and-groove elements are part of the elements being coupled and are not a separate component.

As used herein, the statement that two or more parts or components are "coupled" shall mean that the parts are joined or operate together either directly or indirectly, i.e., through one or more intermediate parts or components, so long as a link occurs. As used herein, "directly coupled" means that two elements are directly in contact with each other. As used herein, "fixedly coupled" or "fixed" means that two components are coupled so as to move as one while maintaining a constant orientation relative to each other. Accordingly, when two elements are coupled, all portions of those elements are coupled. A description, however, of a specific portion of a first element being coupled to a second element, e.g., an axle first end being coupled to a first wheel, means that the specific portion of the first element is disposed closer to the second element than the other portions thereof. Further, an object resting on another object held in place only by gravity is not "coupled" to the lower object unless the upper object is otherwise maintained substantially in place. That is, for example, a book on a table is not coupled thereto, but a book glued to a table is coupled thereto.

As used herein, the phrase "removably coupled" or "temporarily coupled" means that one component is coupled with another component in an essentially temporary manner. That is, the two components are coupled in such a way that the joining or separation of the components is easy and would not damage the components. For example, two components secured to each other with a limited number of readily accessible fasteners, i.e., fasteners that are not difficult to access, are "removably coupled" whereas two components that are welded together or joined by difficult to access fasteners are not "removably coupled." A "difficult to access fastener" is one that requires the removal of one or more other components prior to accessing the fastener wherein the "other component" is not an access device such as, but not limited to, a door.

As used herein, "operatively coupled" means that a number of elements or assemblies, each of which is movable between a first position and a second position, or a first configuration and a second configuration, are coupled so that as the first element moves from one position/configuration to the other, the second element moves between positions/configurations as well. It is noted that a first element may be "operatively coupled" to another without the opposite being true.

As used herein, "temporarily disposed" means that a first elements) or assembly (ies) is resting on a second element(s) or assembly(ies) in a manner that allows the first element/assembly to be moved without having to decouple or otherwise manipulate the first element. For example, a book simply resting on a table, i.e., the book is not glued or fastened to the table, is "temporarily disposed" on the table.

As used herein, "correspond" indicates that two structural components are sized and shaped to be similar to each other and may be coupled with a minimum amount of friction. Thus, an opening which "corresponds" to a member is sized slightly larger than the member so that the member may pass through the opening with a minimum amount of friction. This definition is modified if the two components are to fit "snugly" together. In that situation, the difference between the size of the components is even smaller whereby the amount of friction increases. If the element defining the opening and/or the component inserted into the opening are made from a deformable or compressible material, the opening may even be slightly smaller than the component being inserted into the opening. With regard to surfaces, shapes, and lines, two, or more, "corresponding" surfaces, shapes, or lines have generally the same size, shape, and contours.

As used herein, a "path of travel" or "path," when used in association with an element that moves, includes the space an element moves through when in motion. As such, any element that moves inherently has a "path of travel" or "path." Further, a "path of travel" or "path" relates to a motion of one identifiable construct as a whole relative to another object. For example, assuming a perfectly smooth road, a rotating wheel (an identifiable construct) on an automobile generally does not move relative to the body (another object) of the automobile. That is, the wheel, as a whole, does not change its position relative to, for example, the adjacent fender. Thus, a rotating wheel does not have a "path of travel" or "path" relative to the body of the automobile. Conversely, the air inlet valve on that wheel (an identifiable construct) does have a "path of travel" or "path" relative to the body of the automobile. That is, while the wheel rotates and is in motion, the air inlet valve as a whole, moves relative to the body of the automobile.

As used herein, the statement that two or more parts or components "engage" one another means that the elements exert a force or bias against one another either directly or through one or more intermediate elements or components. Further, as used herein with regard to moving parts, a moving part may "engage" another element during the motion from one position to another and/or may "engage" another element once in the described position. Thus, it is understood that the statements, "when element A moves to element A first position, element A engages element B," and "when element A is in element A first position, element A engages element B" are equivalent statements and mean that element A either engages element B while moving to element A first position and/or element A either engages element B while in element A first position.

As used herein, "operatively engage" means "engage and move." That is, "operatively engage" when used in relation to a first component that is structured to move a movable or rotatable second component means that the first component applies a force sufficient to cause the second component to move. For example, a screwdriver may be placed into contact with a screw. When no force is applied to the screwdriver, the screwdriver is merely "coupled" to the screw. If an axial force is applied to the screwdriver, the screwdriver is pressed against the screw and "engages" the screw. However, when a rotational force is applied to the screwdriver, the screwdriver "operatively engages" the screw and causes the screw to rotate. Further, with electronic components, "operatively engage" means that one component controls another component by a control signal or current.

As used herein, the word "unitary" means a component that is created as a single piece or unit. That is, a component that includes pieces that are created separately and then coupled together as a unit is not a "unitary" component or body.

As used herein, the term "number" shall mean one or an integer greater than one (i.e., a plurality). For example, the phrase "a number of [x]" means one or more of "[x]." As used herein, in the phrase "[x] moves between its first position and second position," or, "[y] is structured to move [x] between its first position and second position," "[x]" is the name of an element or assembly. Further, when [x] is an element or assembly that moves between a number of positions, the pronoun "its" means "[x]," i.e., the named element or assembly that precedes the pronoun "its."

As used herein, "about" in a phrase such as "disposed about [an element, point or axis]" or "extend about [an element, point or axis]" or "[X] degrees about an [an element, point or axis]," means encircle, extend around, or measured around. When used in reference to a measurement or in a similar manner, "about" means "approximately," i.e., in an approximate range relevant to the measurement as would be understood by one of ordinary skill in the art.

As used herein, a "radial side/surface" for a circular or cylindrical body is a side/surface that extends about, or encircles, the center thereof or a height line passing through the center thereof. As used herein, an "axial side/surface" for a circular or cylindrical body is a side that extends in a plane extending generally perpendicular to a height line passing through the center. That is, generally, for a cylindrical soup can, the "radial side/surface" is the generally circular sidewall and the "axial side(s)/surface(s)" are the top and bottom of the soup can.

As used herein, a "user" is a person or construct such as, but not limited to a robot, who interacts with an electrical component system.

As used herein, "generally curvilinear" includes elements having multiple curved portions, combinations of curved portions and planar portions, and a plurality of planar portions or segments disposed at angles relative to each other thereby forming a curve.

As used herein, "generally" means "in a general manner" relevant to the term being modified as would be understood by one of ordinary skill in the art.

As used herein, "substantially" means "for the most part" relevant to the term being modified as would be understood by one of ordinary skill in the art.

As used herein, "at" means on and/or near relevant to the term being modified as would be understood by one of ordinary skill in the art.

Figure 2:
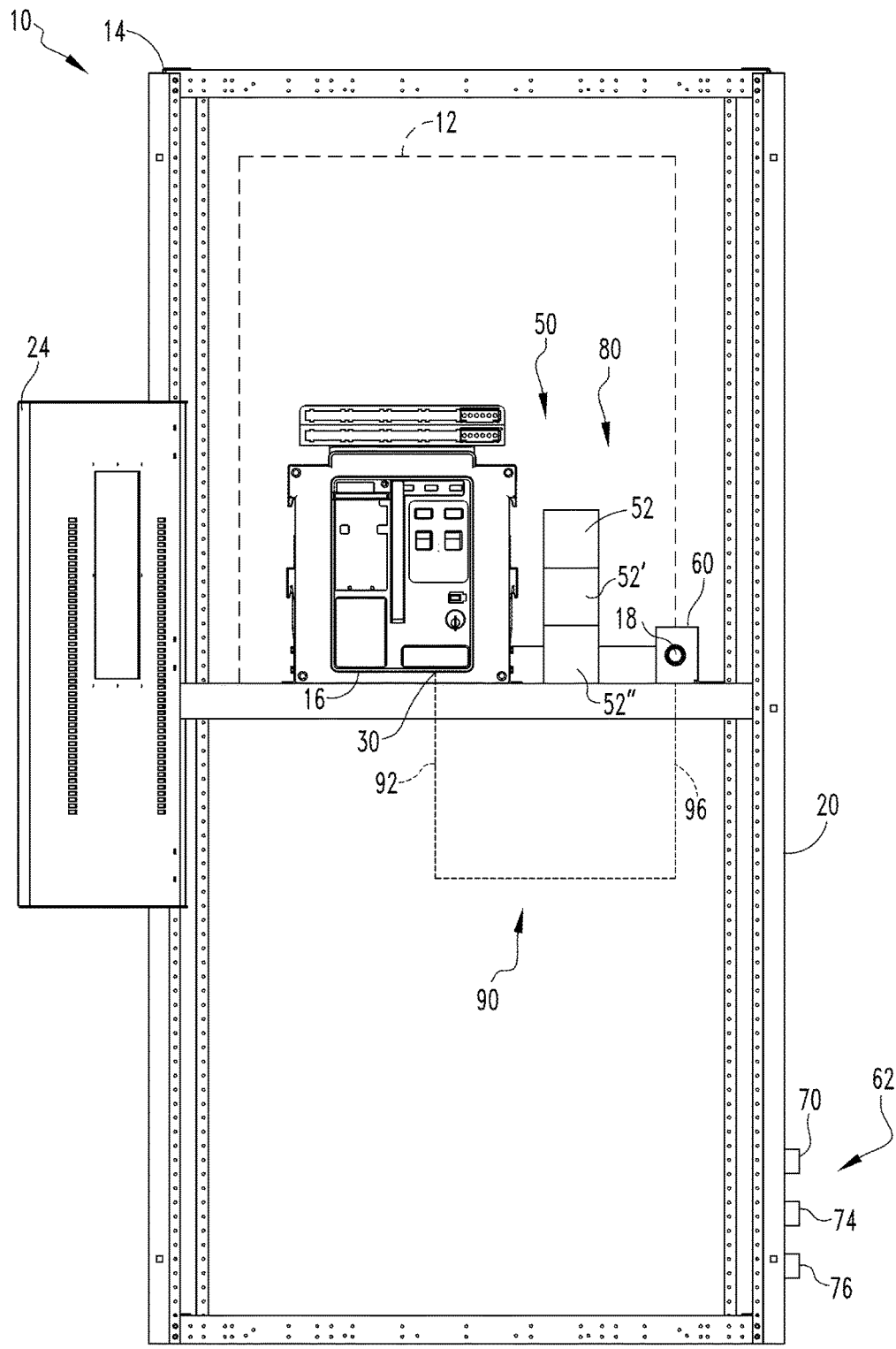
FIG. 2 is a front view of an electrical component system.
Figure 3:
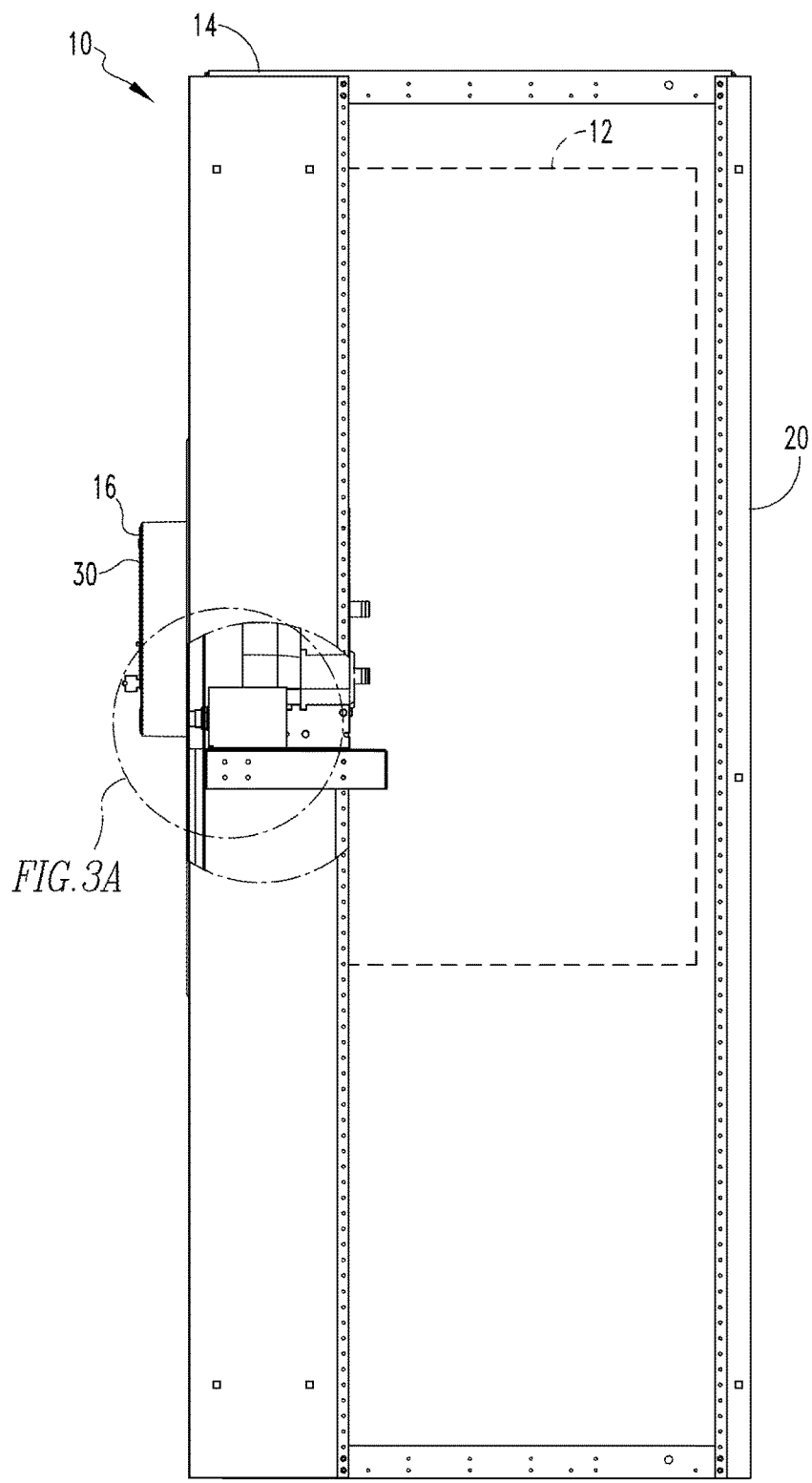
FIG. 3 is a side and partially cross-sectional view of an electrical component system.

As shown in FIGS. 1-3, an electrical component system 10 includes an electrical component 12, a housing assembly 14, an arc reduction assembly 16, and an automatic actuator assembly 18. The electrical component 12, shown schematically, is coupled to, and in electrical communication with, a line and a load (neither shown.) The electrical component 12 is further structured to provide a power to external constructs such as, but not limited to, the arc reduction assembly 16. The housing assembly 14 includes a number of sidewalls (not shown) that define a substantially enclosed space 22. That is, as shown in the figures, only a frame assembly 20 of the housing assembly 14 is visible. It is understood that the housing assembly 14 also includes sidewalls that are coupled, directly coupled, or fixed to the frame assembly 20. The housing assembly 14 also includes a number of doors 24. As used herein a "door" means pivoting and sliding elements that allow access to a generally or substantially enclosed space. Further, as used herein, a "door" inherently moves between two positions; a closed, first position wherein the door blocks access to the enclosed space, and an open, second position wherein the door allows access to the enclosed space. As shown, the housing assembly 14 includes a single door 24; it is understood that this is an exemplary embodiment and the claimed concept is not limited to a housing assembly 14 with a single door 24.

The arc reduction assembly 16 is structured to reduce the likelihood of an electrical arc within the electrical component system housing assembly 14. In an exemplary embodiment, the arc reduction assembly 16 is structured to be in one of, and to move between, a disengaged, first configuration and an engaged, second configuration. That is, in the engaged, second configuration, the arc reduction assembly 16 is structured to reduce the likelihood of an electrical arc within the electrical component system housing assembly 14. When the arc reduction assembly 16 is in the disengaged, first configuration the arc reduction assembly 16 is inactive. In an exemplary embodiment, the arc reduction assembly 16 is coupled to, and in electrical communication with, the electrical component 12. That is, the arc reduction assembly 16 is powered by energy from the electrical component 12.

In an exemplary embodiment, the arc reduction assembly 16 is a maintenance mode circuit breaker 30. The maintenance mode circuit breaker 30 includes an operating mechanism, a movable contact, and a stationary contact (none shown). The movable contact is structured to, and does, move between an open, first position, wherein the movable contact is spaced from, and not in electrical communication with, the stationary contact, and, a closed, second position, wherein the movable contact is directly coupled to, and in electrical communication with, the stationary contact. The operating mechanism is structured to, and does, move the movable contact between the two positions. The operating mechanism is actuated by one of a mechanical input or an electrical input.

During normal operation of the electrical component 12, the arc reduction assembly 16 is in the disengaged, first configuration. That is, when the arc reduction assembly 16 is a maintenance mode circuit breaker 30, the movable contact is in the first position and the maintenance mode circuit breaker 30 is inactive. When a user is near the electrical component 12, as discussed below, the maintenance mode circuit breaker 30 is activated; that is, the movable contact is in the second position.

The automatic actuator assembly 18 includes a passive actuator assembly 50, shown schematically. In an exemplary embodiment, the automatic actuator assembly 18 also includes a detection assembly 60. The passive actuator assembly 50 and the detection assembly 60 are, in one embodiment, coupled to each other and, in another embodiment, are in communication with each other. That is, the passive actuator assembly 50 and the detection assembly 60 are either physically coupled to each other, or, are not physically coupled to each other but are in communication. As used herein, the "passive actuator assembly" 50 of the automatic actuator assembly 18 are those elements that are directly and operatively coupled to the arc reduction assembly 16, which cause the arc reduction assembly 16 to move between the first configuration or the second configuration and which are not part of the common elements of the arc reduction assembly 16. That is, in an exemplary embodiment wherein the arc reduction assembly 16 is a maintenance mode circuit breaker 30, the maintenance mode circuit breaker 30 includes common elements such as, but not limited to, an operating mechanism, a movable contact, and a stationary contact (none shown). Thus, these elements are not part of the "passive actuator assembly" 50. The "passive actuator assembly" 50, however, is structured to be, and is, operatively coupled to elements of the arc reduction assembly 16. Thus, for example, the "passive actuator assembly" 50 is, in an exemplary embodiment, a mechanical element/assembly that is operatively coupled to the operating mechanism of the maintenance mode circuit breaker 30. In an exemplary embodiment wherein the arc reduction assembly 16 is electrically actuated, the "actuator assembly" 50 is an electrical assembly that is operatively coupled to the electrical actuation of the arc reduction assembly 16. Further, the "passive actuator assembly" 50 means that the actuator assembly is not manually operated by a user. That is, as used herein, a "passive actuator assembly" 50 actuates the arc reduction assembly 16 without the user performing any action to specifically actuate the arc reduction assembly 16. It is understood that the passive actuator assembly 50, whether mechanical or electrical, is, in an exemplary embodiment, disposed in a housing for the arc reduction assembly 16, and in this example, within the housing for the maintenance mode circuit breaker 30. Thus, the schematic representation of the passive actuator assembly 50 in the figures is for the purpose of visualization.

The passive actuator assembly 50, in an exemplary embodiment, is operatively coupled to the arc reduction assembly 16 and is structured to configure the arc reduction assembly 16 in one of the first configuration or the second configuration. The passive actuator assembly 50 is further structured to receive, and react to, a "proximity communication" 52, shown schematically as an element. As used herein, a "proximity communication" 52 is a mechanical or electrical construct that is detectable by the automatic actuator assembly 18. That is, as discussed below, the proximity communication 52 is, in one embodiment, a "mechanical construct" which, as used herein, means a combination of a physical element and the position or movement of that element. In another embodiment, the proximity communication 52 is an "electrical construct" which, as used herein, means a signal that is a detectable physical quantity or impulse, such as, but not limited to, a voltage, current, or magnetic field strength by which information is transmitted. The "electrical construct" in one embodiment carries data and, in another embodiment, the presence, or lack thereof, of the signal is the "electrical construct." In an exemplary embodiment, when the proximity communication 52 is not present, the passive actuator assembly 50 configures the arc reduction assembly 16 in the disengaged, first configuration, and, when the proximity communication 52 is present, the passive actuator assembly 50 configures the arc reduction assembly 16 in the engaged, second configuration. That is, the passive actuator assembly 50 is structured to, and does, move between a first configuration and a second configuration corresponding to the configuration of the arc reduction assembly 16.

Before discussing the passive actuator assembly 50 further, the detection assembly 60 is discussed so as to provide examples of different types of proximity communications 52. In one embodiment, the detection assembly 60 includes an electronic sensor assembly 62. The sensor assembly 62 is structured to, and does, detect a user adjacent the housing assembly 14. In an exemplary embodiment, the sensor assembly 62 is one, or more, of an induction proximity sensor 70, a pressure sensor 72, a sonic sensor 74, an optical sensor 76, all shown schematically in FIG. 2, or a contact sensor 78 shown in FIG. 3A. It is understood that the sensor assembly 62 is configured so as to detect a user adjacent the housing assembly 14 or when a housing assembly door 24 is opened/closed. That is, for example, a pressure sensor 72 would include pressure sensitive pads 73 disposed about the housing assembly 14 whereas an optical sensor 76 would include cameras, or similar devices, positioned outside the housing assembly 14 and be structured to detect a user near the housing assembly 14.

As noted above, the sensor assembly 62 is further structured to, and does, provide a proximity communication to the passive actuator assembly 50. In an exemplary embodiment with a sensor assembly 62, the proximity communication is, an electronic signal. Thus, when the sensor assembly 62 provides an electronic signal as a proximity communication, the passive actuator assembly 50 and the sensor assembly 62 are in electronic communication with each other. That is, the passive actuator assembly 50 is in electronic communication with the sensor assembly 62 and is structured to, and does, receive a proximity communication signal 52' therefrom. The sensor assembly 62 is structured to provide the proximity communication signal 52' upon detecting a user adjacent the housing assembly 14. The automatic actuator assembly 18 and the sensor assembly 62 are, in one embodiment, coupled by a signal wire (not shown). In another embodiment, the automatic actuator assembly 18 and the sensor assembly 62 are coupled by a wireless communication assembly (not shown).

In this embodiment, the passive actuator assembly 50 is a communication circuit 80, shown schematically. It is understood that in this embodiment, the arc reduction assembly 16 includes an electric control device structured to move the arc reduction assembly 16 between the first and second configuration. For example, in one embodiment the arc reduction assembly 16 is a maintenance mode circuit breaker 30 including an electronic control device (not shown). The electronic control device of the maintenance mode circuit breaker 30 is structured to cause an operating mechanism to actuate thereby separating, or coupling, a movable contact from/to a stationary contact. The communication circuit 80 is structured to, and does, receive a proximity communication signal 52' from the sensor assembly 62. The communication circuit 80 is further structured to, and does, actuate the electronic control device of the maintenance mode circuit breaker 30 in this example. Thus, the communication circuit 80 is structured to be in a first configuration, wherein no proximity communication signal 52' is present, or, a second configuration, wherein a proximity communication signal 52' is present. As noted above, when the communication circuit 80, i.e., the passive actuator assembly 50, is in the first configuration, the arc reduction assembly 16 is in the disengaged, first configuration and, when the communication circuit 80, i.e., the passive actuator assembly 50, is in the second configuration, the arc reduction assembly 16 is in the engaged, second configuration.

Thus, in this exemplary embodiment, a user approaches an electrical component system 10 to perform maintenance. As the user approaches the electrical component system 10, the sensor assembly 62 detects the presence of the user. For example, the user steps on a pressure sensitive pad 73 disposed in front of the housing assembly 14. In response to detecting the weight of the user, the sensor assembly 62 sends a proximity communication signal 52' to the passive actuator assembly 50. The passive actuator assembly 50, in turn, actuates the arc reduction assembly 16. That is, in the exemplary embodiment described above, the electronic control unit of a maintenance mode circuit breaker 30 causes the operating mechanism to move the movable contact from a first, spaced position relative to a stationary contact, to a second position, wherein the movable contact is coupled to, and in electrical communication with, the stationary contact. That is, the arc reduction assembly 16 moves from a disengaged, first configuration to an engaged, second configuration. Moreover, the arc reduction assembly 16 is actuated with no intentional action from the user to actuate the arc reduction assembly 16. That is, as used herein, approaching an electrical component system 10 is not an intentional action from the user to actuate the arc reduction assembly 16. Thus, the arc reduction assembly 16 is actuated automatically solving the problems noted above.

In another exemplary embodiment, as shown, the sensor assembly 62 includes a contact sensor 78 to which a housing assembly door 24 is operatively coupled. That is, the contact sensor 78, in this embodiment, includes a movable member 79. The contact sensor movable member 79, as shown, is a button 71. The contact sensor movable member 79 is operatively coupled to a switch (not shown). The contact sensor movable member 79 is structured to, and does, move between a first position and a second position that corresponds to the position of the associated housing assembly door 24. Further, when the contact sensor movable member 79 is in the first position, the contact sensor switch is in an open, first configuration. When the housing assembly door 24 moves to its open, second position, the contact sensor movable member 79 is moved to its corresponding second position. The contact sensor movable member 79, in turn, moves the contact sensor switch to a closed, second position. When the contact sensor switch is in a closed, second position, the contact sensor 78 generates a proximity communication signal 52'. The proximity communication signal 52' is communicated to the passive actuator assembly 50, such as the communication circuit 80 as described above. That is, the contact sensor 78 is structured to, and does, provide a proximity communication signal 52' to the passive actuator assembly 50. The passive actuator assembly 50 is structured to, and does, actuate the arc reduction assembly 16 when the proximity communication signal 52' is received, as described above.

In another exemplary embodiment, the detection assembly 60 includes a mechanical interface assembly 90 and the passive actuator assembly 50 includes a mechanical interface member 92 (both shown schematically in FIG. 1). The mechanical interface assembly 60 is operatively coupled to an associated housing assembly door 24. That is, as used herein, to be "operatively coupled to an associated housing assembly door" means that when the housing assembly door 24 moves between the first and second positions, the construct "operatively coupled to an associated housing assembly door" moves to a corresponding configuration/position. Thus, the mechanical interface assembly 90 moves between a first configuration/position and a second configuration/position that corresponds to the housing assembly door 24 position.

Figure 3A:
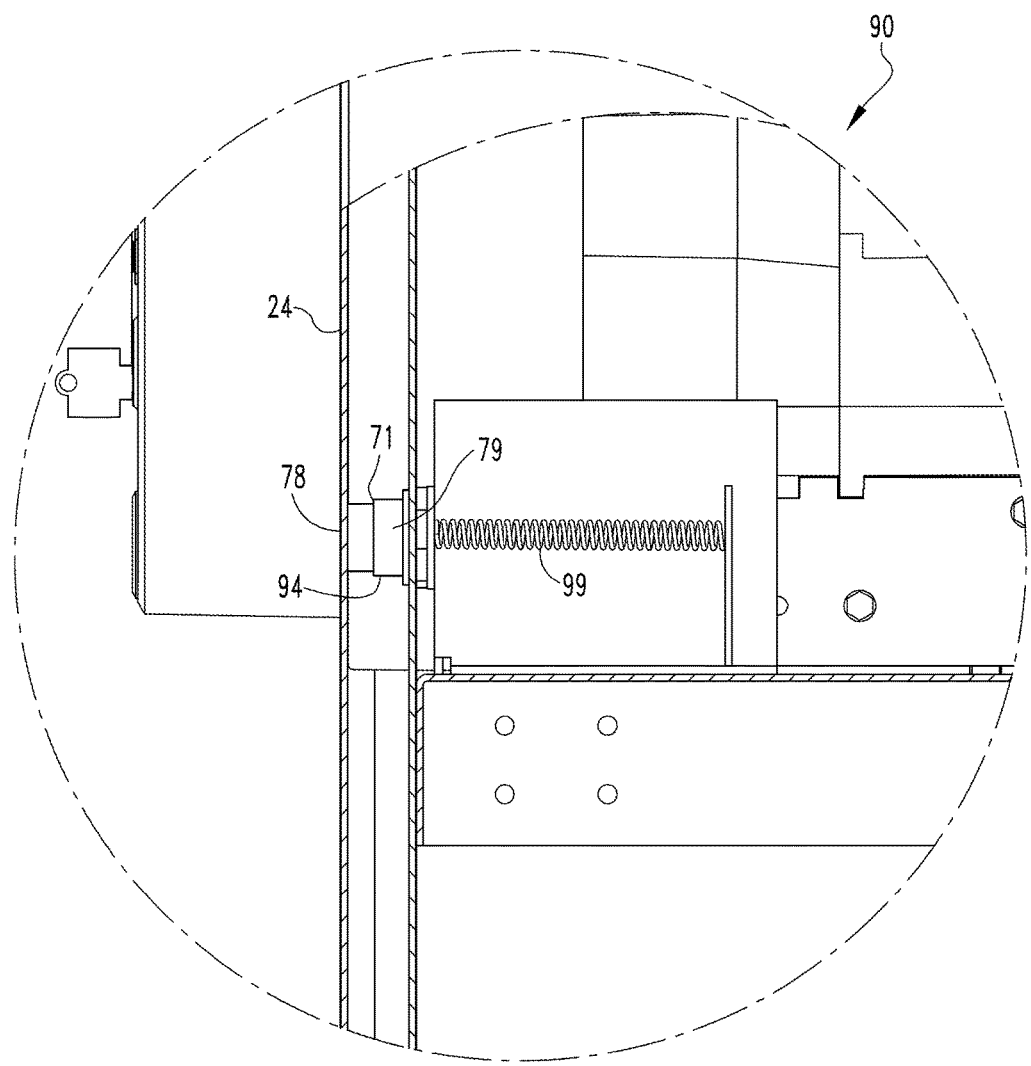
FIG. 3A is a detail side view of a contact sensor.

In an exemplary embodiment, the mechanical interface assembly 90 also includes a door interface member 94 and a linkage assembly 96. A housing assembly door 24 is operatively coupled to the door interface member 94. Thus, similar to the contact sensor movable member 79 described above, the door interface member 94 is structured to, and does, move between a first position and a second position that corresponds to the position of the associated housing assembly door 24. The door interface member 94 is represented in FIG. 3A as the button 71. In an exemplary embodiment, the mechanical interface assembly 90 also includes a biasing device 98, such as, but not limited to, a spring 99. The biasing device 98 is operatively coupled to the door interface member 94 and biases the door interface member 94 to the second position.

Further, the door interface member 94 is operatively coupled, e.g., via linkage assembly 96, to the mechanical interface member 92. Thus, the mechanical interface member 92 is also structured to, and does, move between a first position and a second position that corresponds to the position of the associated housing assembly door 24. The mechanical interface member 92 is further operatively coupled to the arc reduction assembly 16. That is, in an exemplary embodiment where the arc reduction assembly 16 is a maintenance mode circuit breaker 30 with an operating mechanism, the mechanical interface member 92 is operatively coupled to the operating mechanism of the maintenance mode circuit breaker 30. That is, the mechanical interface member 92 provides a proximity communication 52 in the form of a "mechanical construct" as defined above. That is, in this embodiment the proximity communication 52 is a "mechanical proximity communication" 52". As used herein, a "mechanical proximity communication" 52" means a proximity communication 52 that is a mechanical construct.

Thus, in this embodiment, the mechanical interface assembly 90 is disposed adjacent, or immediately adjacent, a housing assembly door 24. When the housing assembly door 24 is in the closed, first position, the door interface member 94 and the mechanical interface member 92 are in their corresponding first positions. When the housing assembly door 24 is opened, the bias from the biasing device 98 causes the door interface member 94 to move to the second position. This, in turn, causes the mechanical interface member 92 to move into its second position. The movement of the door interface member 94 is the proximity communication 52 to the mechanical interface member 92, i.e., the passive actuator assembly 50. Stated alternately, the passive actuator assembly 50 is in mechanical communication with the detection assembly 60 and is structured to, and does, receive a mechanical proximity communication 52 therefrom, and, when the mechanical interface assembly 90 is in the second configuration, the mechanical interface assembly 90 provides the mechanical proximity communication 52. Thus, the mechanical interface assembly 90 and the mechanical interface member 92 are operatively coupled to the arc reduction assembly 16.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. An automatic actuator assembly for an arc reduction assembly in an electrical component system, said electrical component system including a housing assembly with a number of doors, an arc reduction assembly and an electrical component, said electrical component structured to provide a power to external constructs, said arc reduction assembly structured to reduce the likelihood of an electrical arc within the electrical component system housing assembly, said arc reduction assembly structured to be in one of, and to move between, a disengaged, first configuration and an engaged, second configuration, said automatic actuator assembly comprising:

a passive actuator assembly coupled to said arc reduction assembly and structured to configure said arc reduction assembly in one of the said first configuration or said second configuration;

said passive actuator assembly further structured to receive and react to a proximity communication, wherein, when said proximity communication is not present, said passive actuator assembly configures said arc reduction assembly in said disengaged, first configuration, and wherein, when said proximity communication is present, said passive actuator assembly configures said arc reduction assembly in said engaged, second configuration;

a detection assembly, said detection assembly structured to detect at least one of the presence of a user adjacent said housing assembly or movement of the housing assembly door; and
said detection assembly further structured to provide a proximity communication to said passive actuator assembly.

2. The automatic actuator assembly of claim 1 wherein:
said detection assembly includes an electronic sensor assembly;
said sensor assembly structured to detect a user adjacent said housing assembly; and
said sensor assembly structured to provide a proximity communication to said passive actuator assembly.

3. The automatic actuator assembly of claim 2 wherein:
said passive actuator assembly is in electronic communication with said sensor assembly and is structured to receive a proximity communication signal; and
wherein said sensor assembly is structured to provide a proximity communication signal upon detecting a user adjacent said housing assembly.

4. The automatic actuator assembly of claim 3 wherein:
said passive actuator assembly is in electronic communication with said detection assembly and is structured to receive a proximity communication signal;
said sensor assembly includes a contact sensor;
said contact sensor includes a movable member structured to move between a first position and a second position that corresponds to the position of the associated housing assembly door; and
said detection assembly is structured to provide a proximity communication signal when said contact sensor movable member is in said second position.

5. The automatic actuator assembly of claim 3 wherein said sensor assembly is one of an induction proximity sensor, a pressure sensor, a sonic sensor, or an optical sensor.

6. The automatic actuator assembly of claim 1 wherein:
said detection assembly includes a mechanical interface assembly;
said mechanical interface assembly operatively coupled to an associated housing assembly door;
said mechanical interface assembly structured to move between a first configuration and a second configuration, wherein said mechanical interface assembly is in said first configuration when said associated housing assembly door is in a closed, first position, and wherein said mechanical interface assembly is in said second configuration when said associated housing assembly door is in an open, second position.

7. The automatic actuator assembly of claim 6 wherein:
said mechanical interface assembly includes a door interface member and a linkage assembly;
said passive actuator assembly includes a mechanical interface member;
said door interface member operatively coupled to the associated housing assembly door and structured to move between a first position and a second position that corresponds to the position of said associated housing assembly door;
said door interface member operatively coupled to said linkage assembly;
said linkage assembly operatively coupled to said mechanical interface member;
said mechanical interface member structured to move between a first position and a second position corresponding to the position of said associated housing assembly door; and
wherein said mechanical interface member is operatively coupled to said arc reduction assembly.

8. The automatic actuator assembly of claim 7 wherein said mechanical interface assembly is structured to provide a mechanical proximity communication.

9. The automatic actuator assembly of claim 6 wherein:
said passive actuator assembly is in mechanical communication with said detection assembly and is structured to receive a mechanical proximity communication; and
wherein; when said mechanical interface assembly is in said second configuration; said mechanical interface assembly provides said mechanical proximity communication.

10. The automatic actuator assembly of claim 6 wherein:
said mechanical interface assembly includes a biasing device; and
said mechanical interface assembly is biased toward said second configuration.

11. An electrical component system comprising:
a housing assembly with a number of doors;
an arc reduction assembly disposed within said housing assembly, said arc reduction assembly structured to reduce the likelihood of an electrical arc within the electrical component system housing assembly;
said arc reduction assembly structured to be in one of, and to move between, a disengaged, first configuration and an engaged, second configuration;
an electrical component disposed within said housing assembly, said electrical component structured to provide a power to external constructs;
an automatic actuator assembly substantially disposed within said housing assembly, said automatic actuator assembly including a passive actuator assembly and a detection assembly;
said passive actuator assembly coupled to said arc reduction assembly and structured to configure said arc reduction assembly in one of the said first configuration or said second configuration;
said passive actuator assembly further structured to receive and react to a proximity communication, wherein, when said proximity communication is not present, said passive actuator assembly configures said arc reduction assembly in said disengaged, first configuration, and a wherein, when said proximity communication is present, said passive actuator assembly configures said arc reduction assembly in said engaged, second configuration;
said detection assembly structured to detect at least one of the presence of a user adjacent said housing assembly or movement of the housing assembly door; and
said detection assembly further structured to provide a proximity communication to said passive actuator assembly.

12. The electrical component system of claim 11 wherein:
said detection assembly includes an electronic sensor assembly;
said sensor assembly structured to detect a user adjacent said housing assembly; and
said sensor assembly structured to provide a proximity communication to said passive actuator assembly.

13. The electrical component system of claim 12 wherein:
said passive actuator assembly is in electronic communication with said sensor assembly and is structured to receive a proximity communication signal; and
wherein said sensor assembly is structured to provide a proximity communication signal upon detecting a user adjacent said housing assembly.

14. The electrical component system of claim 13 wherein:
said passive actuator assembly is in electronic communication with said detection assembly and is structured to receive a proximity communication signal;
said sensor assembly includes a contact sensor;
said contact sensor includes a movable member that is structured to move between a first position and a second position that corresponds to the position of the associated housing assembly door; and
said detection assembly is structured to provide a proximity communication signal when said contact sensor movable member is in said second position.

15. The electrical component system of claim 13 wherein said sensor assembly is one of an induction proximity sensor, a pressure sensor, a sonic sensor, or an optical sensor.

16. The electrical component system of claim 11 wherein:
said detection assembly includes a mechanical interface assembly;
said mechanical interface assembly operatively coupled to the associated housing assembly door;
said mechanical interface assembly structured to move between a first configuration and a second configuration, wherein said mechanical interface assembly is in said first configuration when said associated housing assembly door is in a closed, first position, and wherein said mechanical interface assembly is in said second configuration when said associated housing assembly door is in an open, second position.

17. The electrical component system of claim 16 wherein:
said mechanical interface assembly includes a door interface member and a linkage assembly;
said passive actuator assembly includes a mechanical interface member;
said door interface member operatively coupled to the associated housing assembly door and structured to move between a first position and a second position that corresponds to the position of said associated housing assembly door;
said door interface member operatively coupled to said linkage assembly;
said linkage assembly operatively coupled to said mechanical interface member;
said mechanical interface member structured to move between a first position and a second position corresponding to the position of said associated housing assembly door; and
wherein said mechanical interface member is operatively coupled to said arc reduction assembly.

18. The electrical component system of claim 17 wherein said mechanical interface assembly is structured to provide a mechanical proximity communication.

19. The electrical component system of claim 16 wherein:
said passive actuator assembly is in mechanical communication with said detection assembly and is structured to receive a mechanical proximity communication; and
wherein, when said mechanical interface assembly is in said second configuration, said mechanical interface assembly provides said mechanical proximity communication.

20. The electrical component system of claim 16 wherein:
said mechanical interface assembly includes a biasing device; and
said mechanical interface assembly is biased toward said second configuration.

* * * * *